(12) United States Patent
Miyagawa

(10) Patent No.: US 7,508,126 B2
(45) Date of Patent: Mar. 24, 2009

(54) DISPLAY DEVICE WITH SPECIFIC PIXEL CONFIGURATION AND MANUFACTURING METHOD THEREOF

(75) Inventor: Keisuke Miyagawa, Zama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 68 days.

(21) Appl. No.: 11/007,281

(22) Filed: Dec. 9, 2004

(65) Prior Publication Data

US 2005/0151462 A1    Jul. 14, 2005

(30) Foreign Application Priority Data

Dec. 17, 2003    (JP)    ............... 2003-420204

(51) Int. Cl.
*H01J 1/62* (2006.01)
*H01J 63/04* (2006.01)

(52) U.S. Cl. .................. 313/504; 313/505; 313/506; 345/45

(58) Field of Classification Search ......... 313/495–512; 345/45

See application file for complete search history.

(56) References Cited

U.S. PATENT DOCUMENTS

| | | | |
|---|---|---|---|
| 5,621,284 A * | 4/1997 | Shichao et al. ............... | 315/366 |
| 5,966,189 A | 10/1999 | Matsuo | |
| 5,986,628 A | 11/1999 | Tuenge et al. | |
| 6,121,726 A | 9/2000 | Codama et al. | |
| 6,275,274 B1 | 8/2001 | Kanemori et al. | |
| 6,326,981 B1 * | 12/2001 | Mori et al. ................... | 345/395 |
| 6,366,025 B1 | 4/2002 | Yamada | |
| 6,414,439 B1 | 7/2002 | Tuenge et al. | |
| 6,466,135 B1 | 10/2002 | Srivastava et al. | |
| 6,570,584 B1 | 5/2003 | Cok et al. | |
| 6,614,498 B1 | 9/2003 | Tanaka et al. | |
| 6,660,332 B2 * | 12/2003 | Kawase et al. ............... | 427/266 |
| 6,856,087 B2 | 2/2005 | Lin et al. | |
| 6,867,549 B2 | 3/2005 | Cok et al. | |
| 6,888,604 B2 | 5/2005 | Rho et al. | |

(Continued)

FOREIGN PATENT DOCUMENTS

CN    2504659 Y    8/2002

(Continued)

OTHER PUBLICATIONS

Wu et al., "P-56: Improving the Image Quality of a Liquid-Crystal Projector by Diffractive Gratings," 1998 SID International Symposium Digest of Technical Papers, May 17-22, 1998, pp. 671-674.

(Continued)

*Primary Examiner*—Peter Macchiarolo
(74) *Attorney, Agent, or Firm*—Eric J. Robinson; Robinson Intellectual Property Law Office, P.C.

(57) ABSTRACT

Element forming regions of the same color are disposed diagonally and a pixel portion has a structure that a region for forming an element are shared by a plurality of pixels. A specific pixel structure of the invention is that element forming regions of a first color, a second color, and a third color are each disposed diagonally and three or more element forming regions are shared by each pixel.

8 Claims, 12 Drawing Sheets

U.S. PATENT DOCUMENTS

| | | | |
|---|---|---|---|
| 6,914,649 B2* | 7/2005 | Liu .......................... 345/694 |
| 6,919,681 B2 | 7/2005 | Cok et al. |
| 6,930,328 B2 | 8/2005 | Kimura et al. |
| 6,989,876 B2 | 1/2006 | Song et al. |
| 7,027,013 B2* | 4/2006 | Ouellete et al. ............... 345/76 |
| 7,129,634 B2 | 10/2006 | Boroson et al. |
| 2002/0167268 A1* | 11/2002 | Aruga et al. ................. 313/500 |
| 2003/0189410 A1 | 10/2003 | Yamazaki et al. |
| 2004/0051724 A1 | 3/2004 | Elliott et al. |
| 2005/0001542 A1* | 1/2005 | Kiguchi ....................... 313/504 |
| 2005/0057172 A1* | 3/2005 | Su et al. .................... 315/169.2 |
| 2005/0127819 A1* | 6/2005 | Ohtani ........................ 313/500 |
| 2005/0151462 A1 | 7/2005 | Miyagawa |
| 2005/0162600 A1 | 7/2005 | Rho et al. |
| 2006/0033422 A1* | 2/2006 | Chao et al. .................. 313/500 |
| 2006/0081844 A1 | 4/2006 | Hirosue et al. |
| 2006/0087227 A1* | 4/2006 | Yamanaka .................. 313/504 |
| 2006/0214566 A1* | 9/2006 | Moriyama et al. .......... 313/504 |
| 2006/0267889 A1 | 11/2006 | Kimura |

FOREIGN PATENT DOCUMENTS

| | | |
|---|---|---|
| JP | 2000-068053 | 9/2000 |
| JP | 2002-299062 | 10/2002 |
| JP | 2004-004822 | 1/2004 |
| WO | WO 2004/017129 | 2/2004 |

OTHER PUBLICATIONS

Zhang et al., "35.4: Three-Dimensional Optical Analyses of Fringing Effect in Small Color Pixels," 2005 SID International Symposium Digest of Technical Papers, May 25-27, 2005, pp. 1302-1305.

"Realization of Natural Color Reproduction in Digital Still Cameras, Closer to the Natural Sight Perception of the Human Eye." Jul. 16, 2003, http://www.sony.net/SonyInfo/News/Press_Archive/200307/03-029E/.

Sony Press Releases, "Realization of Natural Color Reproduction in Digital Still Cameras, Closer to the Natural Sight Perception of the Human Eye," Jul. 16, 2003, http://www.sony.net/SonyInfo/News/Press_Archive/200307/03-029E/.

Office Action (Application No. 200410082147.6) Dated Jul. 11, 2008.

* cited by examiner

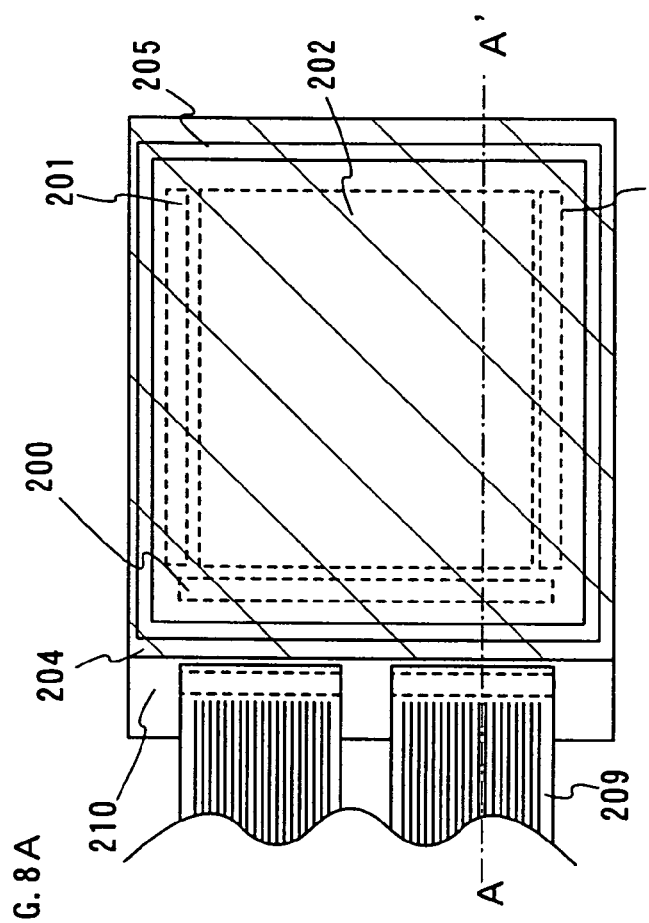
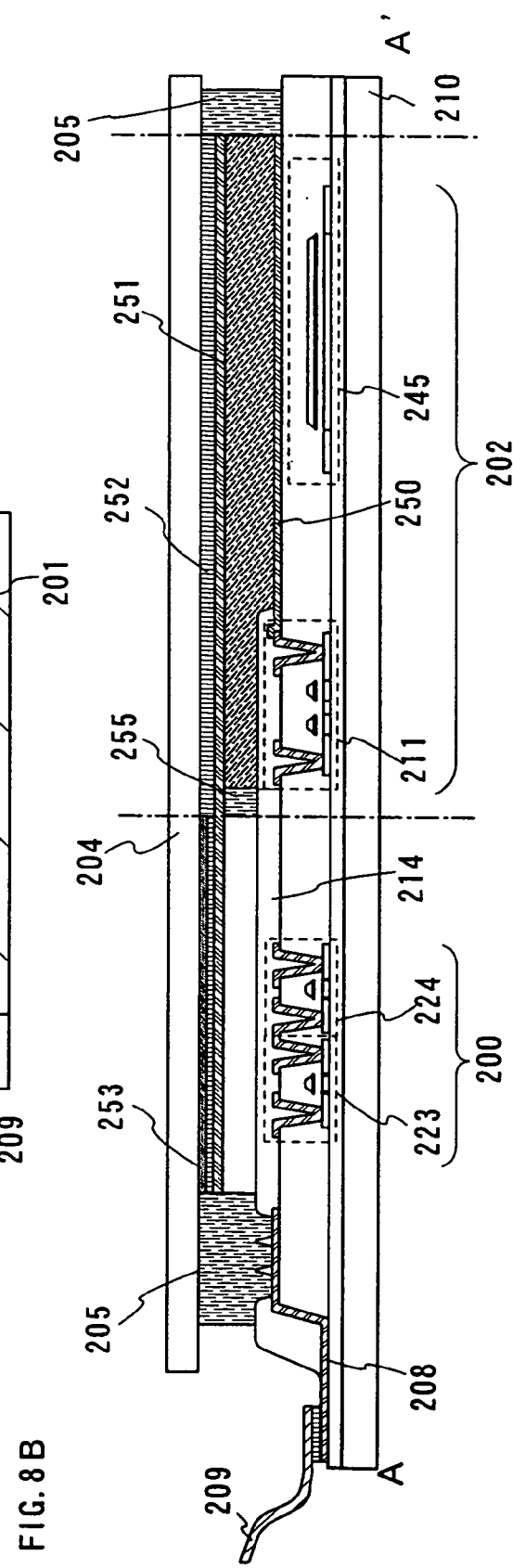
FIG. 8A
FIG. 8B 11R 11G 11B    11R 11G 11B

PRIOR ART

DISPLAY DEVICE WITH SPECIFIC PIXEL CONFIGURATION AND MANUFACTURING METHOD THEREOF

BACKGROUND OF THE INVENTION

1. Field of the Invention

The present invention relates to a layout of a pixel portion having a light emitting element, an active matrix display device having the pixel portion, and a manufacturing method thereof.

2. Description of the Related Art

A display device having light emitting elements in a pixel portion is formed by using a metal mask to form the light emitting elements of red (R), green (G) and blue (B) are formed separately. In the case where the light emitting elements are formed of low molecular weight materials, for example, the light emitting elements of red (R), green (G) and blue (B) are formed separately by vapor deposition using a metal mask to form a pixel portion which can realize a full color display.

For manufacturing a light emitting element by vapor deposition, there is a manufacturing method of an organic light emitting device in order to achieve a large size and high definition, in which a ratio of a portion corresponding to a light emitting portion on which a light emitting element is deposited and a width of a boundary portion between adjacent light emitting elements is set to be 1:0.5 or more in a vapor deposition mask (metal mask) used when dividing light emitting elements of each color (see Patent Document 1). Patent Document 1 describes that by slightly changing the pattern of a metal mask and a vapor deposition operation, finely patterned pixels are realized and a full color display can be formed without aligning the mask, thus a large display with high definition can be formed more easily.

Further, apertures are formed in a stripe shape in a metal mask as shown in FIG. 2 of Patent Document 1. As shown in FIG. 9A, a pixel portion 10 includes a plurality of pixels 12 which includes regions 11R, 11G, and 11B which form each element of RBG respectively. As shown in FIG. 9B, the regions 11R, 11G, and 11B for forming each of RGB are divided in rectangular shapes by a bank 13 formed of an insulator before vapor deposition, thereby regions of the same color can be deposited commonly in a column direction. In this manner, row directions are divided by the bank 13, therefore, apertures in stripe shapes (slit shapes) that are long in a column direction are formed in a metal mask.

[Patent Document 1]

Japanese Patent Laid-Open No. 2000-68053

SUMMARY OF THE INVENTION

To increase the resolution of such a display device having a light emitting element, intervals between the element forming regions are required to be narrow, which affects the resolution of a display. The intervals between the apertures in a metal mask used for forming light emitting elements in these element forming regions are limited in consideration of strength and patterning precision. Therefore, the intervals between the apertures of the mask cannot be easily narrowed.

Further, as intervals between pixels are required to be narrow in order to increase the resolution, intervals between semiconductor elements or wirings are required to be narrow. Even in the case where the intervals between the wirings and the like can be made narrow, the intervals between the apertures of the metal mask are not still narrowed easily. Therefore, as the intervals between the pixels are narrowed, a rate of an aperture to a pixel in area, that is an aperture ratio is decreased since the intervals between the apertures of the metal mask cannot easily be narrowed as described above.

In this manner, even when a patterning precision for forming a semiconductor element and a wiring finer is improved, high definition of a display device having a light emitting element is not expected since the intervals between the apertures of the metal mask cannot be narrow.

In view of the aforementioned, the invention provides a layout of a pixel having a light emitting element which achieves high definition by a novel method and a display device having the layout.

In view of the aforementioned problem, according to the invention, element forming regions of the same color are disposed diagonally and a pixel portion has a structure that an element forming region is shared by a plurality of pixels. Further, a display device having the aforementioned pixel structure is provided.

A specific pixel structure of the invention is that element forming regions of a first color, a second color, and a third color are each disposed diagonally and three or more element forming regions are shared by each pixel. The invention provides a display device having the aforementioned pixel structure.

Another pixel structure of the invention is that element forming regions of the first color, the second color, and the third color are each disposed diagonally and three or more element forming regions are shared by each pixel. Each pixel has same color regions of the first color, the second color, and the third color selected from different element forming regions. The invention provides a display device having the aforementioned pixel structure.

Another pixel structure of the invention is that an element forming region of the first color, an element forming region of the second color which is disposed adjacently in the same column as the element forming region of the first color, an element forming region of the third color which is disposed adjacently in the same column as the element forming region of the second color are provided. The element forming regions for the first color, the second color, and the third color are disposed diagonally. Each pixel has same color regions of the first color, the second color, and the third color selected from the element forming region of the first color, the element forming region of the second color, and the element forming region of the third color. The invention provides a display device having the aforementioned pixel structure.

Another pixel structure of the invention is that an element forming region of the first color, an element forming region of the second color which is disposed adjacently in the same column as the element forming region of the first color, an element forming region of the third color which is disposed adjacently in the same column as the element forming region of the second color are provided. The element forming regions of the first color, the second color, and the third color are disposed so that they are offset by one pitch in a row direction. Pitch is width of the element forming region. Each pixel has same color regions of the first color, the second color, and the third color selected from the element forming region of the first color, the element forming region of the second color, and the element forming region of the third color. The invention provides a display device having the aforementioned pixel structure.

Each pixel has a substitute region in which an extra light emits or no light emits.

Specifically, each pixel has same color regions of the first color, the second color, and the third color disposed in an L-shape. Alternatively, each pixel has same color regions in an L-shape in which a same color region of the second color is disposed in a row direction of the same color region of the first color and a same color region of the third color is disposed in a column direction thereof.

With the aforementioned pixel structure, high definition of a display device, for example a display device having a light emitting element (hereinafter referred to as a light emitting device) can be achieved. Further, an aperture ratio of a pixel is not decreased.

Another pixel structure of the invention is that an element forming region of the first color, an element forming region of the second color which is disposed adjacently in the same column as the element forming region of the first color, an element forming region of the third color which is disposed adjacently in the same column as the element forming region of the second color are provided. The element forming regions of the first color, the second color, and the third color are disposed so that they are offset by 1.5 pitches in a column direction. Each pixel has same color regions of the first color, the second color, and the third color selected from the element forming region of the first color, the element forming region of the second color, and the element forming region of the third color. The invention provides a display device having the aforementioned pixel structure.

Specifically, each pixel has same color regions of the first color, the second color, and the third color disposed in a T-shape(delta pattern). Further, each pixel has same color regions of the second and third colors in a row direction of the same color region of the first color and the same color regions of the second and the third colors are disposed in a T-shape so that they are offset by 1.5 pitches in a column direction of the same color region of the first color. Alternatively, each pixel is arranged in a triangle shape as same color regions of any one of the first color, the second color, and the third color being an apex.

With the aforementioned pixel structure, high definition of a light emitting device can be achieved. Further, an aperture ratio of a pixel is not decreased. In addition, as the aforementioned pixel structure has no substitute region, an element forming region can be efficiently used.

Another pixel structure of the invention is that element forming regions of the first color, the second color, and the third color are each disposed diagonally and an element forming region is shared by three or more pixels. Each pixel has same color regions of the first color, the second color, and the third color selected from different element forming regions. A first insulating film provided between adjacent same color regions has a width narrower than that of a second insulating film provided between element forming regions. The invention provides a display device having the aforementioned pixel structure.

Specifically, the first insulating film provided between adjacent same color regions in a column direction has a width narrower than that of the second insulating film provided between adjacent element forming regions. Alternatively, the first insulating film provided between adjacent same color regions in a row direction has a width narrower than that of the second insulating film provided between adjacent element forming regions.

Note that the pixel structure of the invention is not limited to the aforementioned one. Any pixel structure can be employed as long as each pixel is formed of same color regions selected from element forming regions disposed diagonally. As a result, high definition of a light emitting device can be achieved without decreasing an aperture ratio.

Note that all of the pixels in the pixel portion is not required to satisfy the alignment of each color, but certain arbitrary pixels are. This arbitrary pixel is hereafter referred to as one pixel in some cases.

A manufacturing method of a display device of the invention is that an element forming region of the first color, an element forming region of the second color which is disposed adjacently in the same column as the element forming region of the first color, an element forming region of the third color which is disposed adjacently in the same column as the element forming region of the second color are provided. The element forming regions of the first color, the second color, and the third color are disposed diagonally so as to be shared by each pixel. Each pixel is formed to have same color regions of the first color, the second color, and the third color selected from the element forming regions of the first color, the second color, and the third color.

Another manufacturing method of a display device of the invention is that an element forming region of the first color, an element forming region of the second color which is disposed adjacently in the same column as the element forming region of the first color, an element forming region of the third color which is disposed adjacently in the same column as the element forming region of the second color are provided. The element forming regions for the first color, the second color, and the third color are disposed diagonally so that they are offset by one pitch in a row direction and they are shared by each pixel. Each pixel is formed to have same color regions of the first color, the second color, and the third color selected from the element forming regions of the first color, the second color, and the third color.

Another manufacturing method of a display device of the invention is that an element forming region of the first color, an element forming region of the second color which is disposed adjacently in the same row as the element forming region of the first color, an element forming region of the third color which is disposed adjacently in the same row as the element forming region of the second color are provided. The element forming regions of the first color, the second color, and the third color are formed so that they are offset by 1.5 pitches in a column direction. Each pixel is formed to have same color regions of the first color, the second color, and the third color selected from the element forming regions of the first color, the second color, and the third color.

Another manufacturing method of a display device of the invention having an element forming region having same color regions disposed diagonally and shared by three or more pixels, and same color regions of the first color, the second color, and the third color selected from different element forming regions, and the element forming region is shared by three or more pixels is that the first insulating film provided between adjacent same color regions has a width narrower than that of the second insulating film provided between element forming regions.

Note that the first color, the second color, and the third color may be red (R), green (G), and blue (B) respectively, for example.

According to the invention, apertures of the metal mask are provided diagonally in order to form element forming regions of the same color arranged diagonally. The mask having diagonal apertures can be used commonly in forming elements of each color. It is preferable since the apertures of the metal mask are not required to be fined, for element forming regions having a plurality of same color regions are provided.

According to a pixel structure in which element forming regions and same color regions are arranged in an L-shape or a T-shape, a display device which achieves high definition can be formed without narrowing intervals between adjacent element forming regions (hereinafter referred to as element pitches). In other words, a high definition display device can be formed without narrowing the apertures of a metal mask. As a result, a high definition display device can be realized without decreasing the aperture ratio.

As wide element forming regions can be provided in the metal mask of the invention, it is preferable that apertures of the metal mask are not required to be fined.

BRIEF DESCRIPTION OF THE DRAWINGS

FIGS. 8A and 8B are diagrams each showing a liquid crystal display device having a pixel of the invention.

DETAILED DESCRIPTION OF THE INVENTION

Figure 1A:
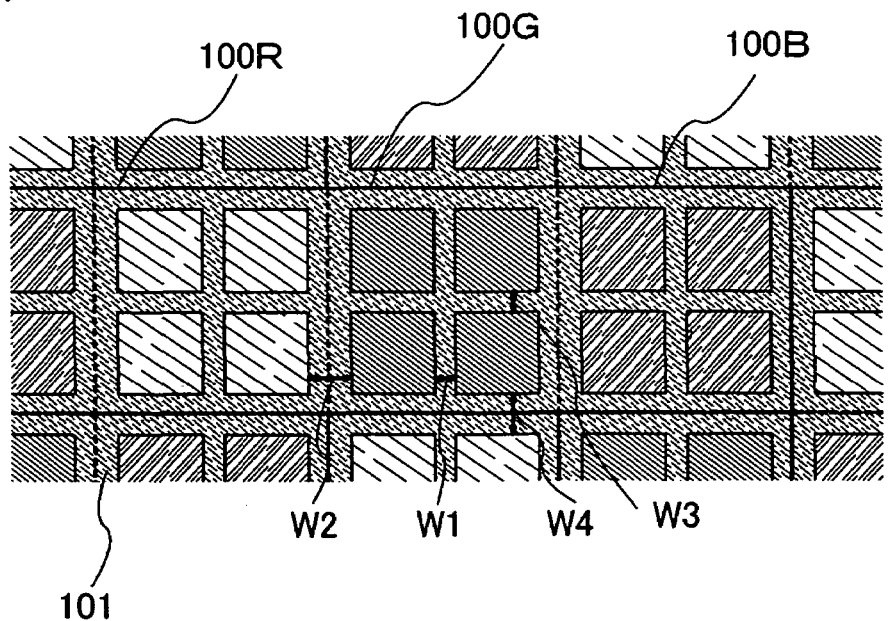
FIGS. 1A and 1B are diagrams each showing a layout of a pixel of the invention.

Although the present invention will be fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein. Note that identical portions in embodiment modes are denoted by the same reference numerals and detailed descriptions thereof are omitted.

Although a transistor includes three terminals which are a gate, a source, and a drain, the source terminal (source electrode) and the drain terminal (drain electrode) cannot be distinguished clearly due to a structure of a transistor. Therefore, when describing a connection between the elements, one of the source electrode and the drain electrode is referred to as a first electrode and the other is referred to as a second electrode.

Embodiment Mode 1

FIG. 1A shows element forming regions 100R, 100G, 100B, and a bank 101 each surrounded by a dotted lines. Each element forming region is provided with four regions in which elements of the same color are formed which are divided by a bank formed of an insulator and the like (hereinafter such a region in which elements of the same color are formed is referred to as a same color region). In such a pixel structure, a width of a bank provided between adjacent element forming regions corresponds to a width of an aperture of a metal mask.

As for a width of a bank in a column direction (X direction), a width W1 of the bank in a same color region can be narrower than a width W2 of a bank between adjacent element forming regions. Similarly in a row direction (Y direction), a width W3 of a bank in the same color region can be narrower than a width W4 of a bank between adjacent element forming regions. That is, a width of a bank can be narrower in a same color region. The width of a bank between adjacent element forming regions is affected by deposition precision. On the other hand, the width of a bank in a same color region is affected by exposure precision. Generally, the exposure precision is higher than the deposition precision, therefore, the width of the bank in a same color region can be narrower than the width of a bank between adjacent element forming regions. As a result, the aperture ratio is not decreased even in the case of narrowing intervals between pixels (hereinafter referred to as a pixel pitch).

Figure 1B:
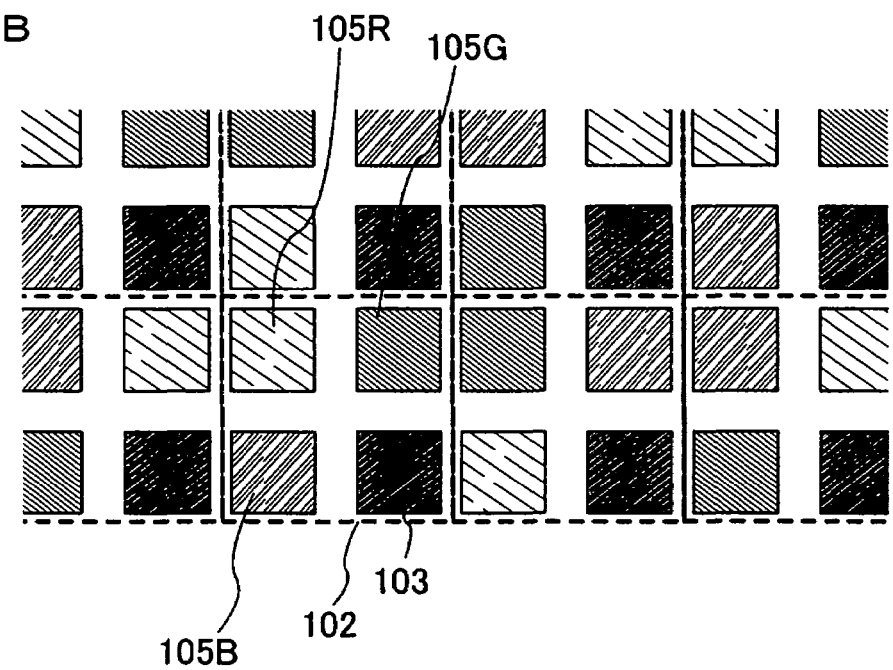

FIG. 1B shows a pixel arrangement formed of element forming regions. In FIG. 1B, a region surrounded by a dotted line corresponds to a pixel 102. The pixel includes same color regions of adjacent RGB and a substitute region 103. The substitute region is a region in which any of same color regions of RGB is formed and which may be in a non-light emitting state when performing display.

Further, in the pixel structure shown in FIGS. 1A and 1B, it can be said that element forming regions of RGB are arranged in an L-shape and same color regions of RGB are arranged in an L-shape in a pixel as well. The arrangement in an L-shape means that an element forming region of the second color is arranged in a row direction of an element forming region of the first color and an element forming region of the third color is arranged in a column direction thereof. In a pixel, a same color region of the second color is arranged in a row direction of a same color region of the first color and a same color region of the third color is arranged in a column direction thereof. In the pixel 102, for example, a same color region 105G of the color G is arranged in a row direction of a same color region 105R of the color R and a same color region 105B of the color B is arranged in a column direction thereof.

With the aforementioned pixel structure, a high definition light emitting device can be achieved. Further, as a bank in a same color region can be narrow, an aperture ratio can be increased.

Figure 2A:
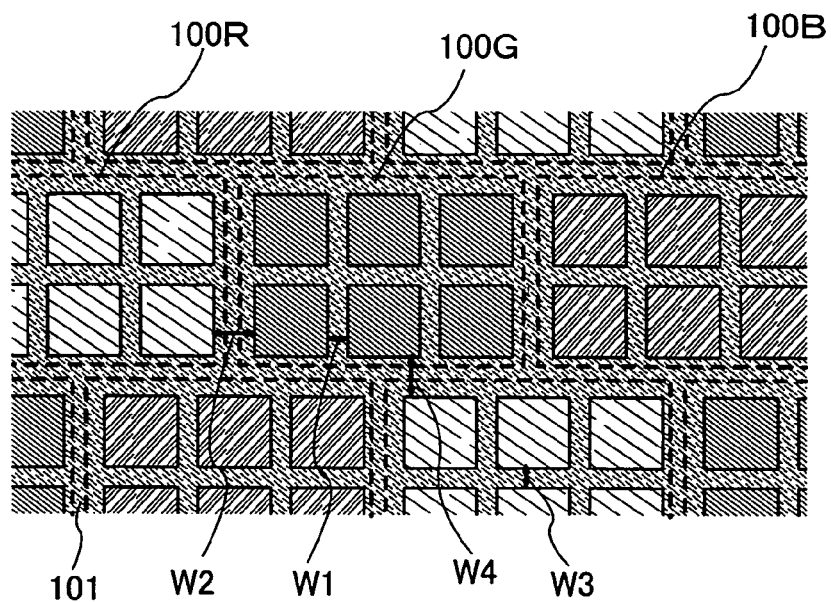
FIGS. 2A and 2B are diagrams each showing a layout of a pixel of the invention.
Figure 2B:
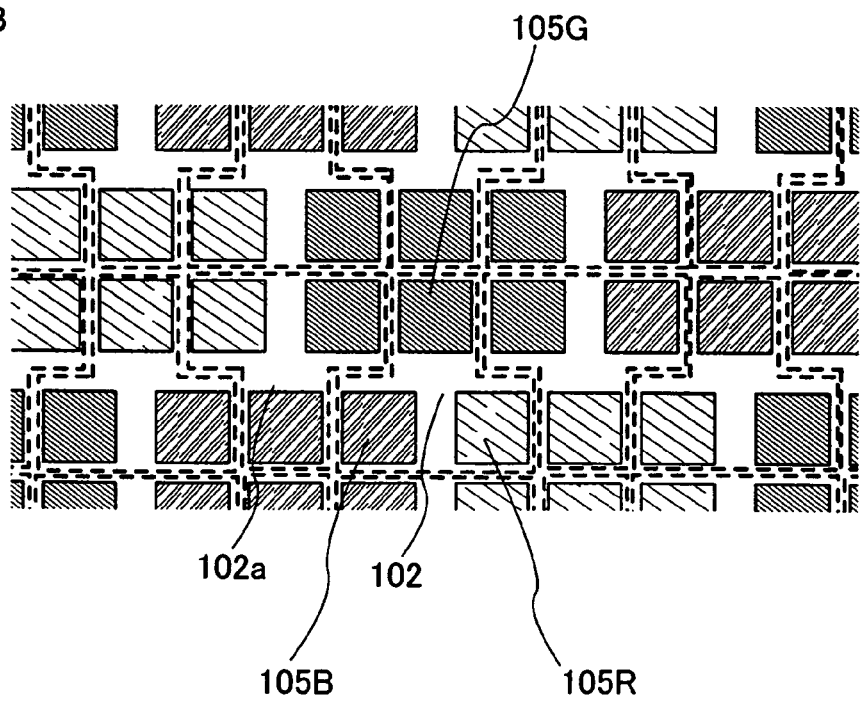

A pixel structure that is different from FIGS. 1A and 1B are shown in FIGS. 2A and 2B. FIG. 2A shows element forming regions 100R, 100G, 100B, and the bank 101 each surrounded by a dotted lines. Each of the element forming regions is different from those in FIGS. 1A and 1B in that six same color regions are provided which are divided by a bank.

In the pixel structure shown in FIGS. 2A and 2B similarly to FIGS. 1A and 1B, a width W1 of a bank in a same color region can be narrower than a width W2 of a bank between adjacent element forming regions in a column direction. Similarly in a row direction, a width W3 of a bank in the same color region can be narrower than a width W4 of a bank between adjacent element forming regions. That is, a bank can be narrower in the same color region. The width of a bank between adjacent element forming regions depends on deposition precision. On the other hand, the width of a bank in a same color region depends on an exposure precision. Generally, the exposure precision is higher than the deposition precision, therefore, the width of the bank in a same color region can be narrower than the width of a bank between adjacent element forming regions. As a result, aperture ratio is not decreased even in the case of narrowing intervals between pixels (hereinafter referred to as a pixel pitch).

FIG. 2B shows a pixel arrangement formed of element forming regions. In FIG. 2B, a region surrounded by a dotted line corresponds to the pixel 102. In FIG. 2B, a pixel can be formed without providing a substitute region. As a result, it is preferable that an element forming region can be efficiently used. In the pixel 102, same color regions of RGB selected from each element forming regions are different from those in FIGS. 1A and 1B in that they are arranged in a T-shape. The arrangement in a T-shape means that element forming regions of the second and the third colors are arranged in a column direction of an element forming region of the first color while an element forming region of an n-th row and an element forming region of (n+1)th row are arranged so that they are offset by 1.5 pitches. In a pixel, same color regions of the second and the third colors are arranged in a row direction of a same color region of the first color while the same color regions of the second and the third colors are arranged so that they are offset against the same color region of the first color in a column direction by 1.5 pitches. In the pixel 102, for example, the same color region 105R of the color R and the same color region 105B of the color B are arranged in a row direction of the same color region 105G of the color G while the same color region 105R of the color R and the same color region 105B of the color B are arranged so that they are offset against the same color region 105G of the color G in a column direction by 1.5 pitches. That is, in the pixel, same color regions of RGB are arranged in a triangle shape as a certain color being an apex. In the pixel 102, specifically, the same color region 105R of the color R and the same color region 105B of the color B are arranged as the same color region 105G of the color G being an apex. In a pixel 102a disposed adjacent to the pixel 102, same color regions of RGB are arranged similarly. The pixel 102a is arranged in a triangle shape as the same color region 105B of the color B being an apex, and further the apex is in a different direction than that in the pixel 102, that is the triangle shape is arranged upside down in a row direction.

With the aforementioned pixel structure, high definition of a light emitting device can be achieved. Further, an aperture ratio of a pixel is not decreased. In addition, as the aforementioned pixel structure has no substitute region, an element forming region can be efficiently used.

According to the pixel structure of the invention, a display device which achieves high definition can be formed without narrowing element pitches. In other words, a high definition display device can be formed without narrowing the apertures of a metal mask. As a result, a high definition display device can be realized without decreasing the aperture ratio. That is, an aperture ratio is not decreased even in the case of narrowing a pixel pitch by forming semiconductor elements and wirings provided in a pixel portion finely, thus a high definition display device can be realized.

The elements can be formed in a pixel arrangement having such a layout by using liquid droplet ejection method which is a method by which a pattern can selectively be formed. According to the liquid droplet ejection method, liquid droplets (also referred to as dots) mixed with materials of a conductive film and an insulating film and the like are selectively ejected (discharged). The liquid droplet ejection method is also referred to as an ink-jetting method depending on its system.

Such a pixel structure and an arrangement can be applied to a color filter included in a light emitting device or a liquid crystal display device. In this case, a black matrix including resin containing chromium and the like can be formed instead of a bank. By using a color filter, a full color display can be realized without forming elements of RGB. By forming a light emitting element which exhibits white light emission and providing a color filter arranged according to the layout of the invention, a light emitting device which can realize a full color display can be fabricated.

By using a color filter in a light emitting device in which elements of each color are formed, a display in higher definition can be provided. With a color filter, a broad peak of a light emission spectrum from elements of each color can be corrected to be sharp.

Embodiment Mode 2

In this embodiment mode, a layout of an active matrix panel is described. Note that a switching transistor, an erasing transistor, and a driving transistor are provided in each pixel in this embodiment, however, the invention is not limited to this.

Figure 3:
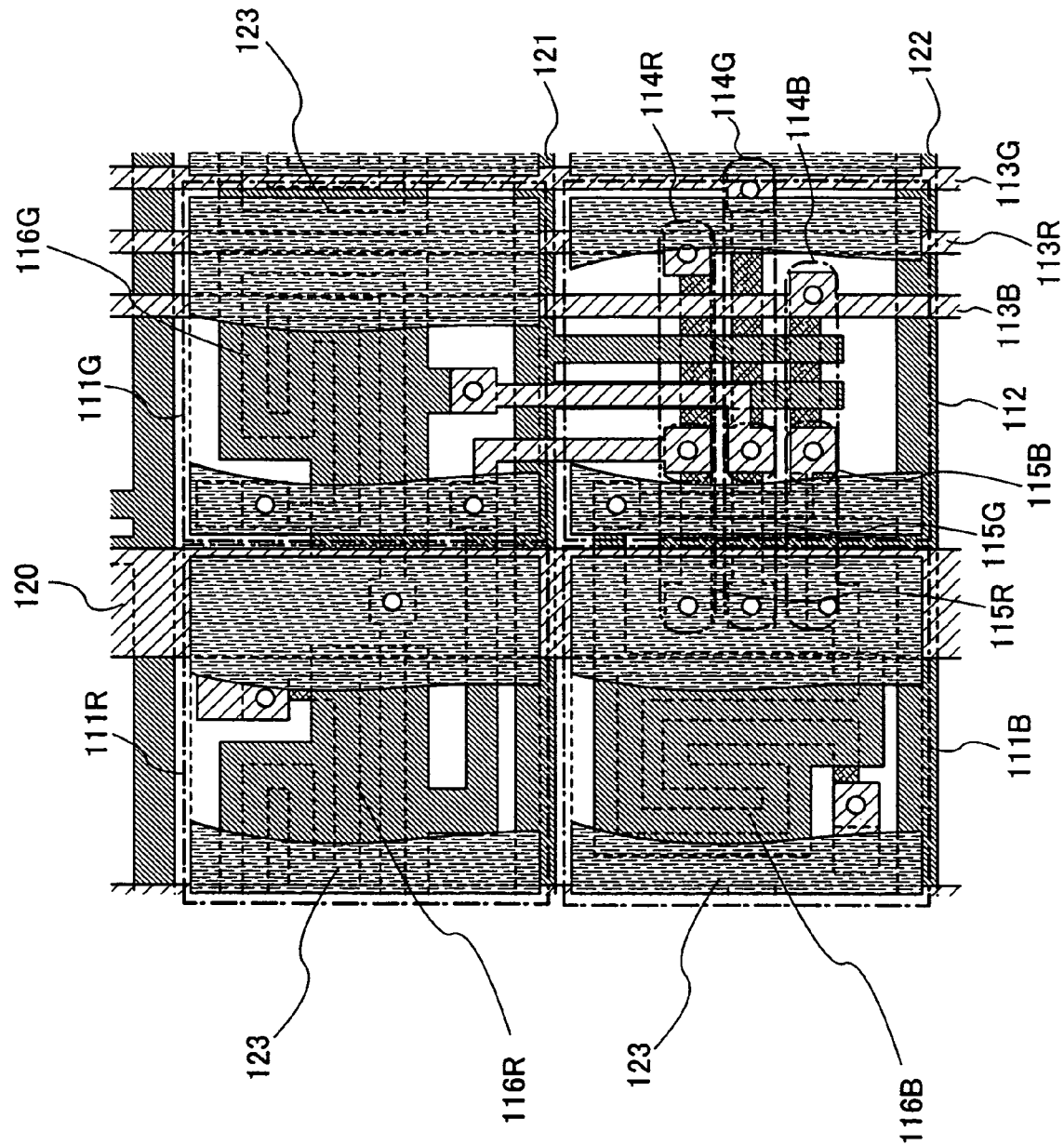
FIG. 3 is a diagram showing a layout of a pixel of the invention.

FIG. 3 is a top plan view of an enlarged pixel having same color regions arranged in the L-shape. An upper left region is a same color region 111R of the color R, a region adjacent to the same color region 111R in a column direction is a same color region 111G of the color G, and a region adjacent to the same color region 111R in a row direction is a same color region 111B of the color B. A lower right region is a substitute region 112 which is not used as a light-emitting region although one element of RGB is formed.

The same color regions are provided with driving transistors 116R, 116G, and 116B respectively, and pixel electrodes 123 to be connected to one electrode of each driving transistor. Note that portions of a pixel electrode are not drawn in FIG. 3 for showing the driving transistors with no obstructions.

It is preferable that the driving transistor operates in a saturation region and controls a current supplied to a light emitting element. Therefore, a channel length (L) of the driving transistor is preferably designed to be longer than a channel width. In this embodiment mode, a semiconductor film of the driving transistor is formed in a serpentine shape so that the channel length becomes long. The driving transistor may operate in a linear region as well.

Polarity of the driving transistor may be an N-channel type or a P-channel type. In this embodiment mode, the polarity of the driving transistor is P-channel type.

Moreover, each of switching transistors 114R, 114G, and 114B is provided which is connected to a gate electrode of each of the driving transistors. Signal lines 113R, 113G, and 113B are provided which are connected to one electrode of each of the switching transistors. A current is supplied to a light emitting element by a video signal inputted from the signal line, thus a display is performed. Accordingly, the signal line is provided for each switching transistor.

Specifically, when the switching transistor is turned ON, charge is accumulated in a capacitor. When the charge becomes equal to a value of Vgs of the driving transistor, the driving transistor is turned ON and a current is supplied to a light emitting element. A capacitor is not provided in FIG. 3, however, it is not necessarily provided in the case where gate capacitance of a transistor is sufficient.

The switching transistor has a double-gate structure having two gate electrodes for a semiconductor film. A conductive film which functions as the gate electrode can be shared by each switching transistor. Note that each gate electrode can be formed of the same conductive film as a first scan line 121.

Further, erasing transistors 115R, 115G, and 115B are provided which are connected to gate electrodes of the driving transistors and one electrode of each switching transistor. A power source line 120 is provided which is commonly connected to one electrode of each erasing transistors 115R, 115G, and 115B. The erasing transistors are only required to be connected so that they discharge the charge accumulated in the capacitor, therefore, the invention is not limited to the structure of FIG. 3.

Further, the switching transistor has a double-gate structure having two gate electrodes for a semiconductor film. A conductive film which functions as the gate electrode can be shared by each switching transistor. Note that each gate electrode can be formed of the same conductive film as a second scan line 122. Moreover, the first scan line and the second scan line can be formed of the same conductive film.

Polarity of the switching transistor and the erasing transistor may be an N-channel type or a P-channel type. In this embodiment mode, both transistors are N-channel type thin film transistors (TFTs) since it is preferable to have the same polarity to simplify the manufacturing steps.

The switching transistors and the erasing transistors are provided in the substitute region 112. As a result, it can be prevented that an aperture ratio is decreased in a same color region. Further, the switching transistor and the erasing transistor may be formed in each same color region as well.

A transistor having each function can be an enhancement or depletion thin film transistor. Further, it may be a thin film transistor having a semiconductor.

The semiconductor may be formed not only of silicon but silicon germanium. In the case of using silicon germanium, a concentration thereof is preferably about 0.01 to 4.5 atomic %. Also, the semiconductor may be any one selected from an amorphous semiconductor, a semi-amorphous semiconductor (also referred to as an SAS) in which an amorphous state and a crystalline state are mixed, a micro-crystalline semiconductor in which crystal grains of 0.5 to 20 nm are observed in an amorphous semiconductor, and a crystalline semiconductor. In particular, a micro-crystalline state in which crystal grains of 0.5 to 20 nm are observed is referred to as a micro crystal (μc). Although a thin film transistor having a top gate structure is described in this embodiment mode, a thin film transistor having a bottom gate structure may be used as well. In the case of using an amorphous semiconductor, a semi-amorphous semiconductor, or a micro-crystalline semiconductor, a bottom gate structure is preferably used.

A conductive film of a gate electrode used for a thin film transistor, a scan line and the like can be formed by sputtering or a liquid droplet ejection method. Further, conductive films of the source electrode, the drain electrode, the signal line, the power source line and the like can be formed by sputtering or the liquid droplet ejection method as well. In the case of employing sputtering, an element selected from tantalum, tungsten, titanium, molybdenum, aluminum, and copper, or an alloy material or a compound material containing the aforementioned element as a main component can be used as a material of a conductive film. In the case of employing the liquid droplet ejection method, an element selected from gold, silver, and copper, or an alloy material or a compound material containing the aforementioned element as a main component can be used as a material of a conductive film.

Further, a pixel electrode can be formed by using a light-transmitting material such as indium tin oxide (ITO), IZO (Indium Zinc Oxide) obtained by mixing 2 to 20% of zinc oxide (ZnO) in indium oxide, ITO-SiOx (referred to as ITSO or NITO for convenience) obtained by mixing 2 to 20% of silicon oxide ($SiO_2$) in indium oxide, organic indium, organotin. Alternatively, a non-light-transmitting material such as an element selected from tantalum, tungsten, titanium, molybdenum, aluminum, and copper as well as silver (Ag) or an alloy material or a compound material containing the aforementioned element as a main component can be used.

A structure that light emitted from a pixel electrode side which transmits light is emitted from a substrate side on which thin film transistors are provided is referred to as a bottom emission type, a structure that the light is emitted from a counter substrate side is referred to as a top emission type, and a structure that the light is emitted from the both substrate sides is referred to as a dual emission type. The invention can employ any of the aforementioned structures.

Although not shown in FIG. 3, a bank is provided. A width of a bank in a same color region can be narrower than a width of a bank between element forming regions in a row direction.

With the aforementioned pixel structure, a full color display at high definition can be performed.

With the pixel structure as described in this embodiment mode, a high definition display device can be formed without narrowing an element pitch. In other words, a high definition display device can be formed without narrowing a width of apertures of a metal mask since intervals between element forming regions are not required to be narrowed. As a result, a high definition display device can be achieved without decreasing an aperture ratio. That is, a high definition display device can be realized without decreasing an aperture ratio even in the case where deposition precision cannot easily be increased since semiconductor elements and wirings provided in a pixel portion are formed finely and a pixel pitch can be narrowed.

As already described, elements can also be formed in a pixel arrangement having the aforementioned layout by the liquid droplet ejection method by which a pattern can selectively be formed.

As already described, such a pixel structure and an arrangement can be applied to a color filter included in a light emitting device or a liquid crystal display device.

Embodiment Mode 3

In this embodiment mode, a layout of an active matrix panel which is different than the aforementioned embodiment mode is described. Note that a switching transistor, an erasing transistor, and a driving transistor are provided in each pixel in this embodiment mode, however, the invention is not limited to this.

Figure 4:
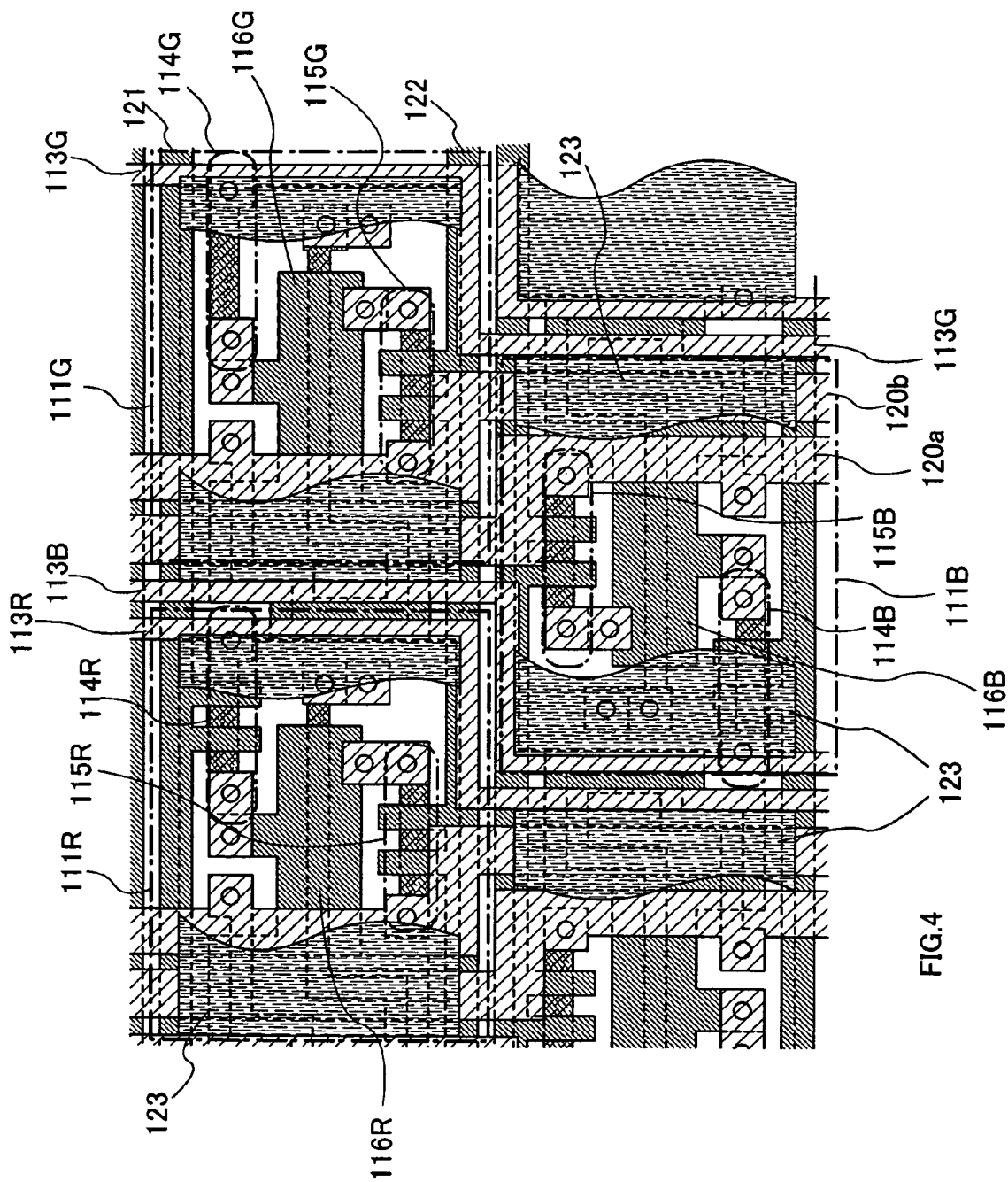
FIG. 4 is a diagram showing a layout of a pixel of the invention.

FIG. 4 shows a top plan view of an enlarged pixel having same color regions arranged in the T-shape. FIG. 4 is different than FIG. 3 in that an upper left region is the same color region 111R of the color R, a region adjacent to the same color region 111R in a column direction is the same color region 111G of the color G, and a region disposed below the same color region 111R with an offset of 1.5 pitches in a column direction is the same color region 111B of the color B. That is, in each pixel, the same color regions 111R, 111G, and 111B are arranged in a triangle shape.

In a pixel shown in FIG. 4, a substitute region is not provided, which is different than the aforementioned embodiment mode. It is preferable since an element forming region can be efficiently used as a result.

Similarly to the aforementioned embodiment mode, each of the same color regions is provided with the driving transistors 116R, 116G, and 116B respectively, and the pixel electrodes 123 to be connected to one electrode of each driving transistor. Note that portions of a pixel electrode are not drawn in FIG. 4 either for showing the driving transistors with no obstructions.

Similarly to the aforementioned embodiment mode, each switching transistor 114R, 114G, and 114B connected to a gate electrode of each driving transistor is provided and each signal line 113R, 113G, and 113B connected to one electrode of each switching transistor is provided. A current is supplied to a light emitting element by a video signal inputted from the signal line, thus a display is performed. Accordingly, the signal line is provided for each switching transistor. As same color regions are formed so that they are offset by 1.5 pitches in a column direction in this embodiment mode, signal lines meander in a rectangular shape.

Similarly to the aforementioned embodiment mode, the erasing transistors 115G, 115G, and 115B each connected to a gate electrode of each driving transistor and one electrode of each switching transistor are provided and power source lines 120a and 120b commonly connected to one electrode of each of the erasing transistors 115R, 115G, and 115B are provided. The power source lines 120a and 120b are connected to one electrode of each of the erasing transistors in odd columns and the other electrode of each of the transistors in even columns respectively. A width of the power source line is formed to be wider as compared to a width of the signal line. As the power source line is shared by each driving transistor, resistance of the power source line is required to be decreased. Similarly to the signal line, the power source line is provided so as to meander in a rectangular shape. The erasing transistor is only required to be connected so as to discharge the charge accumulated in a capacitor, therefore, the invention is not limited to the structure of FIG. 4.

Similarly to the aforementioned embodiment mode, the first scan line 121 and the second scan line 122 are provided.

Figure 5:
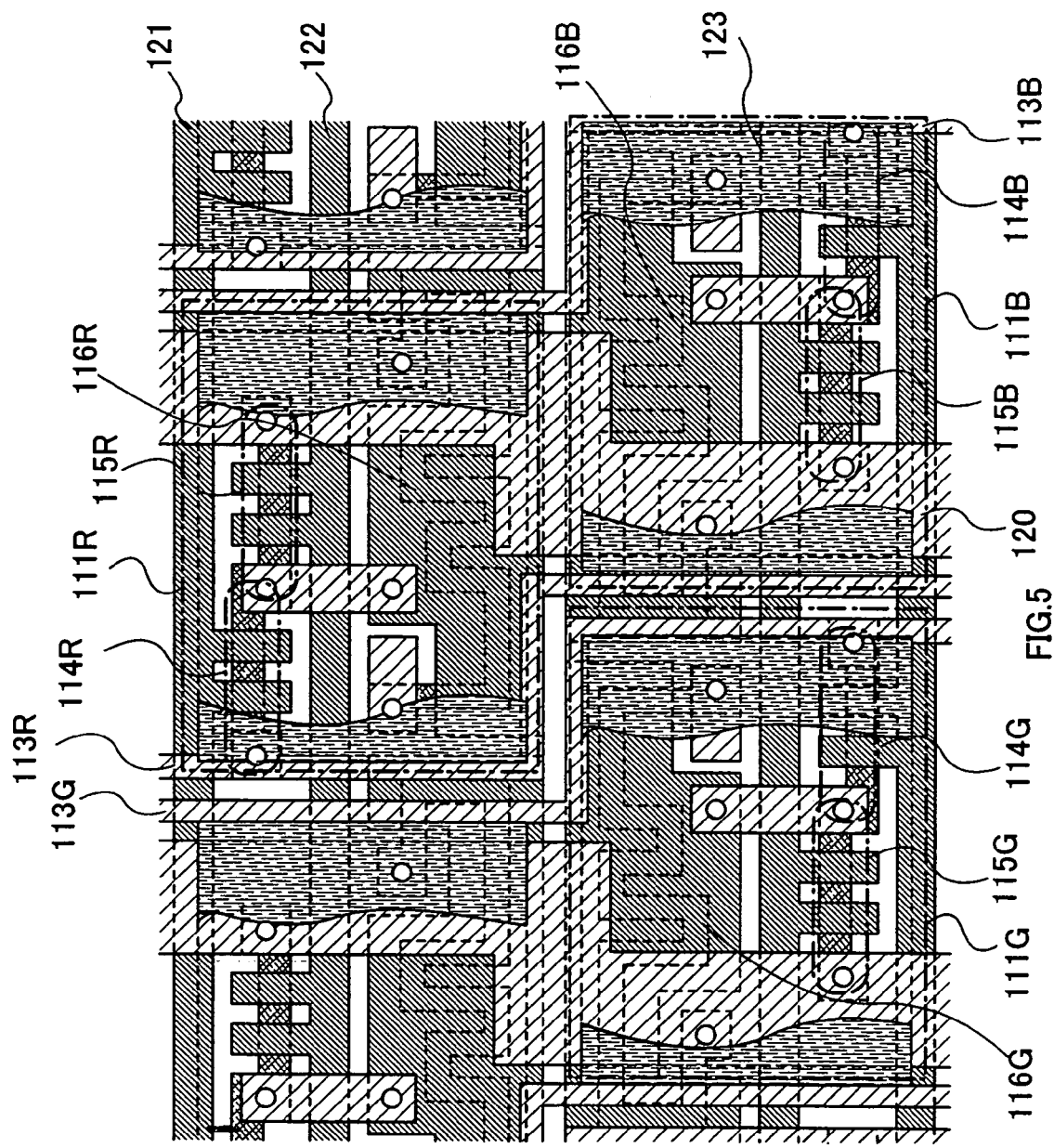
FIG. 5 is a diagram showing a layout of a pixel of the invention.

FIG. 5 shows a layout in the case of sharing the power source line, which is different than FIG. 4. In a certain pixel in FIG. 5, the same color regions 111R, 111G, and 111B are arranged in a triangle shape as the same color region 111R being an apex. In FIG. 5, specifically, an upper region is the same color region 111R of the color R, adjacent regions to the same color region 111R in a row direction are the same color region 111G of the color G and the same color region 111B of the color B. The same color regions 111G of the color G and the same color region 111B of the color B are arranged with an offset of 1.5 pitches in a column direction of the same color region 111R of the color R.

Similarly to the aforementioned embodiment mode and FIG. 4, the driving transistors 116R, 116G, and 116B, the pixel electrodes 123 each connected to one electrode of each driving transistor, the switching transistors 114R, 114G, and 114B, the signal lines 113R, 113G, and 113B each connected to one electrode of the switching transistor, the erasing transistors 115R, 115G, and 115B, a power source line 120 commonly connected to one electrode of the erasing transistors 115R, 115G, and 115B, the first scan line 121, and the second scan line 122 are provided respectively. The signal lines and the power source line are provided so as to meander in a rectangular shape.

The power source line 120 in FIG. 5 is different than FIG. 4 in that it is commonly connected to one electrode of an erasing transistor in each column. By sharing the power source line, a margin between the power source lines can be reduced. Accordingly, a width of the power source line can be increased. The width of the power source line is formed to be wider as compared to the width of the signal line. As the power source line is shared by each driving transistor, a resistance of the power source line is required to be decreased.

In this manner, a pixel having same color regions arranged in a T-shape can have various layouts.

In this embodiment mode also, any of the bottom emission type, the top emission type, and the dual emission type can be employed.

Although not shown in FIGS. 4 and 5, a bank is provided. A width of a bank in a same color region in a row direction can be narrower than a width of a bank between adjacent element forming regions.

With the pixel structure as described in this embodiment mode, a high definition display device can be formed without narrowing an element pitch. In other words, a high definition display device can be formed without narrowing a width of apertures of a metal mask since intervals between element forming regions are not required to be narrowed. As a result, a high definition display device can be achieved without decreasing an aperture ratio. That is, a semiconductor element and a wiring provided in a pixel portion is formed finely, a pixel pitch can be narrowed and a high definition display device can be realized without decreasing an aperture ration even in the case where deposition precision cannot easily be increased. In addition, as the aforementioned pixel structure has no substitute region, an element forming region can efficiently be used.

As already described, elements can also be formed in a pixel arrangement having the aforementioned layout by the liquid droplet ejection method by which a pattern can selectively be formed.

As already described, such a pixel structure and an arrangement can be applied to a color filter included in a light emitting device or a liquid crystal display device.

Embodiment Mode 4

In this embodiment mode, a pixel circuit of a light emitting device and an operation thereof are described.

Figure 6A:
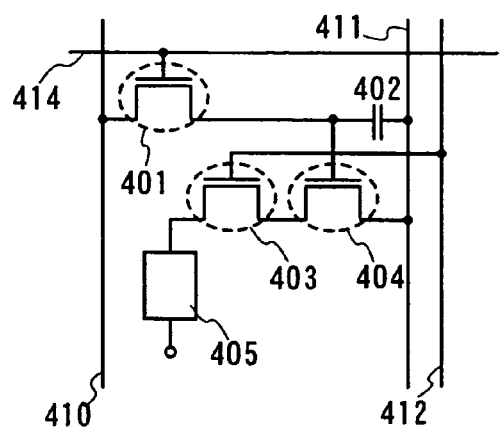
FIGS. 6A to 6F are diagrams each showing a pixel circuit of the invention.

A pixel circuit shown in FIG. 6A has a signal line 410, power source lines 411 and 412 in a column direction and a scan line 414 in a row direction. Moreover, a current controlling transistor 404 is included in addition to a switching transistor 401, a driving transistor 403, a capacitor 402 and a light emitting element 405.

Figure 6B:
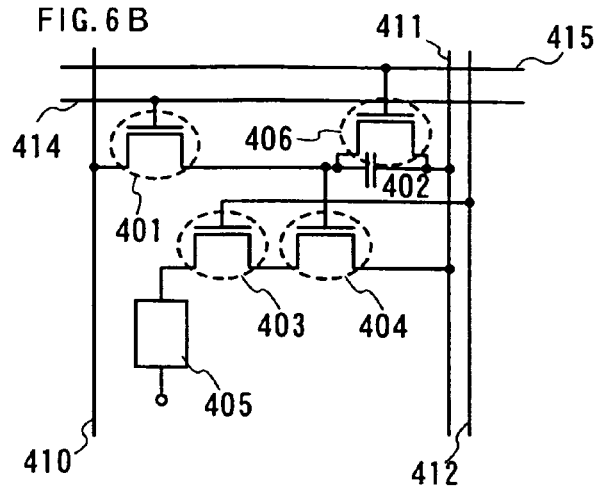
Figure 6C:
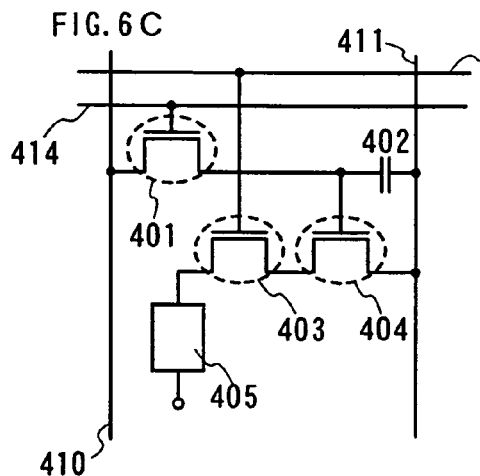

A pixel circuit shown in FIG. 6C is different than the pixel circuit shown in FIG. 6A in that a gate electrode of the driving transistor 403 is connected to the power source line 412 disposed in a row direction although other arrangements are identical. That is, the pixels shown in FIGS. 6A and 6C are equivalent circuits. However, each power source line is formed of a conductive film of different layers between the case where the power source line 412 is disposed in a column direction (FIG. 6A) and the case where the power source line 412 is disposed in a row direction (FIG. 6C). Here, a wiring to which the gate electrode of the driving transistor 403 is connected is focused, therefore FIGS. 6A and 6C are shown separately to show that the layers for forming the wirings are different.

The pixel circuits shown in FIGS. 6A and 6C each has a current controlling transistor 404 connected in series in addition to the driving transistor 403. A channel length L (403) and a channel width W (403) of the driving transistor 403 and a channel length L (404) and a channel width W (404) of the current controlling transistor 404 are preferably formed so as to satisfy L (403)/W (403):L (404)/W (404)=5 to 6000:1.

Note that the driving transistor 403 controls a current value supplied to the light emitting element 405 and preferably operates in a saturation region as described above. Further, the current controlling transistor 404 controls a current supply to the light emitting element 405 and preferably operates in a linear region. It is preferable that both of the transistors have the same polarity to simplify the manufacturing steps, therefore, the polarity of the both transistors are designed to be N-channel type in this embodiment mode. A depletion type transistor as well as an enhancement type transistor can be used for the driving transistor 403 and the current controlling transistor 404. According to the invention having the aforementioned structure, the current controlling transistor 404 operates in a linear region, therefore, a sight change of Vgs of the current controlling transistor 404 does not affect a current value supplied to the light emitting element 405. That is, the current value supplied to the light emitting element 405 can be determined by the driving transistor 403 which operates in a saturation region. According to the aforementioned structure, a variation in luminance is improved which is caused by a variation in characteristics of each transistor of a light emitting element, thus a display device of which image quality is improved can be provided.

In pixel circuits shown in FIGS. 6A to 6D, the switching transistor 401 controls an input of a video signal to the pixel. When the switching transistor 401 is turned ON, a video signal is inputted to the pixel. Then, a charge of the video signal is held in the switching transistor 402. Note that FIGS. 6A and 6C each has a capacitor 402, however, it is not necessarily provided in the case where the charge of the video signal can be held by gate capacitance of the transistor and the like.

Figure 6D:
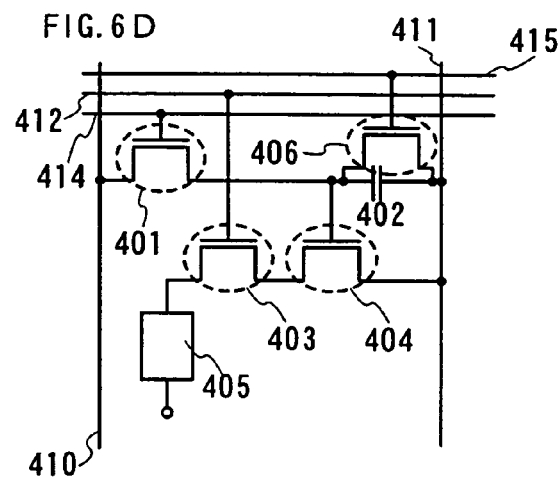

A pixel circuit shown in FIG. 6B is different than the pixel circuit shown in FIG. 6A in that an erasing transistor 406 and a scan line 415 connected to a gate electrode of the erasing transistor 406 are additionally provided although other arrangements are identical. Similarly, the pixel circuit shown in FIG. 6D is different than the pixel circuit shown in FIG. 6C in that the erasing transistor 406 and the scan line 415 connected to the gate electrode of the erasing transistor 406 are additionally provided although other arrangements are identical.

The erasing transistor 406 is controlled to be ON or OFF by the scan line 415. When the erasing transistor 406 is turned ON, the charge held in the capacitor 402 is discharged and the current controlling transistor 404 is turned OFF. That is, depending on the arrangement of the erasing transistor 406, it is possible to forcibly obtain a state that a current is not supplied to the light emitting element 405 forcibly. Therefore, in the pixel circuits each having an erasing transistor as shown in FIGS. 6B and 6D, a light emitting period can be started at the same time or right after a writing period is started, without waiting for signals to be written to all the pixels. Therefore, a duty ratio can be improved.

Figure 6E:
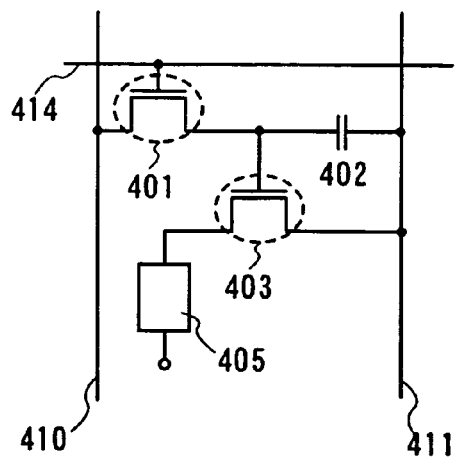
Figure 6F:
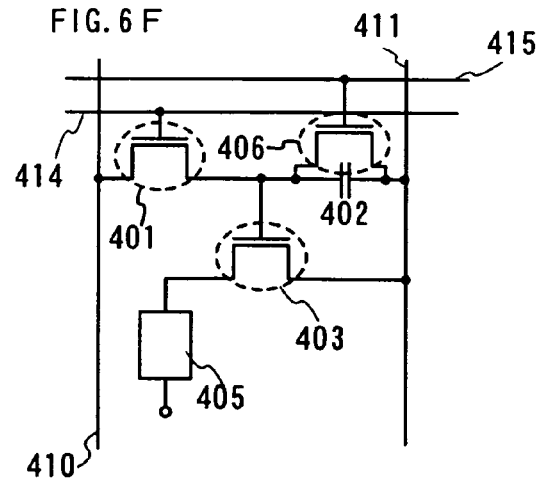

A pixel circuit shown in FIG. 6E includes the signal line 410, the power source line 411 in a column direction and the scan line 414 in a row direction. Further, the switching transistor 401, the driving transistor 403, the capacitor 402 and the light emitting element 405 are provided. A pixel circuit shown in FIG. 6F corresponds to a pixel circuit having the layout described in the aforementioned embodiment mode and is different than the pixel circuit shown in FIG. 6E in that the erasing transistor 406 and the scan line 415 are additionally provided although other arrangements are identical. Note that depending on an arrangement of the erasing transistor 406 in the pixel circuit shown in FIG. 6F, a duty ratio thereof can be improved as well.

In the case of using a thin film transistor having an amorphous semiconductor and the like, in particular, it is preferable to form a channel length of the driving transistor long. Therefore, in consideration of an aperture ratio, it is preferable to use the pixel circuit of FIG. 6E or 6F which has fewer transistors.

Such an active matrix light emitting device which is provided with a transistor in each pixel is advantageous since a low voltage drive can be performed even in the case where a pixel density is increased. On the other hand, a passive matrix light emitting device in which a transistor is provided per each column can be formed as well. A passive matrix light emitting device which is not provided with a transistor in each pixel, is suitable for a top emission or a dual emission type light emitting device since a high aperture ratio is achieved. The layout of the aforementioned embodiment mode can be employed in such a passive matrix light emitting device.

As described above, various pixel circuits can be employed.

Embodiment Mode 5

In this embodiment mode, a structure of a light emitting device in which a signal driver circuit, a scan driver circuit, and a pixel portion are integrally formed is described.

Figure 7A:
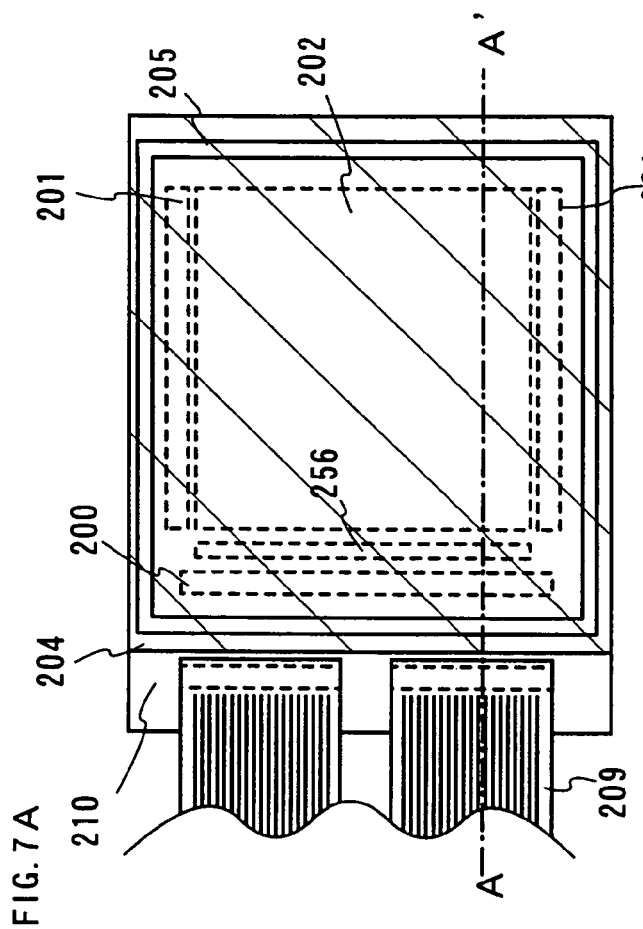
FIGS. 7A and 7B are diagrams each showing a light emitting device having a pixel of the invention.

FIG. 7A is a top plan view of a light emitting device in which a signal driver circuit 200, a scan driver circuit 201, and a pixel portion 202 are provided on a first substrate 210 to which a second substrate 204 is adhered with a sealing material 205. Further, a connecting region 256 between the signal driver circuit 200 and the pixel portion 202 is provided and a signal from an external circuit is inputted to the signal driver circuit 200 and the scan driver circuit 201 through a flexible printed circuit (FPC) 209.

Figure 7B:
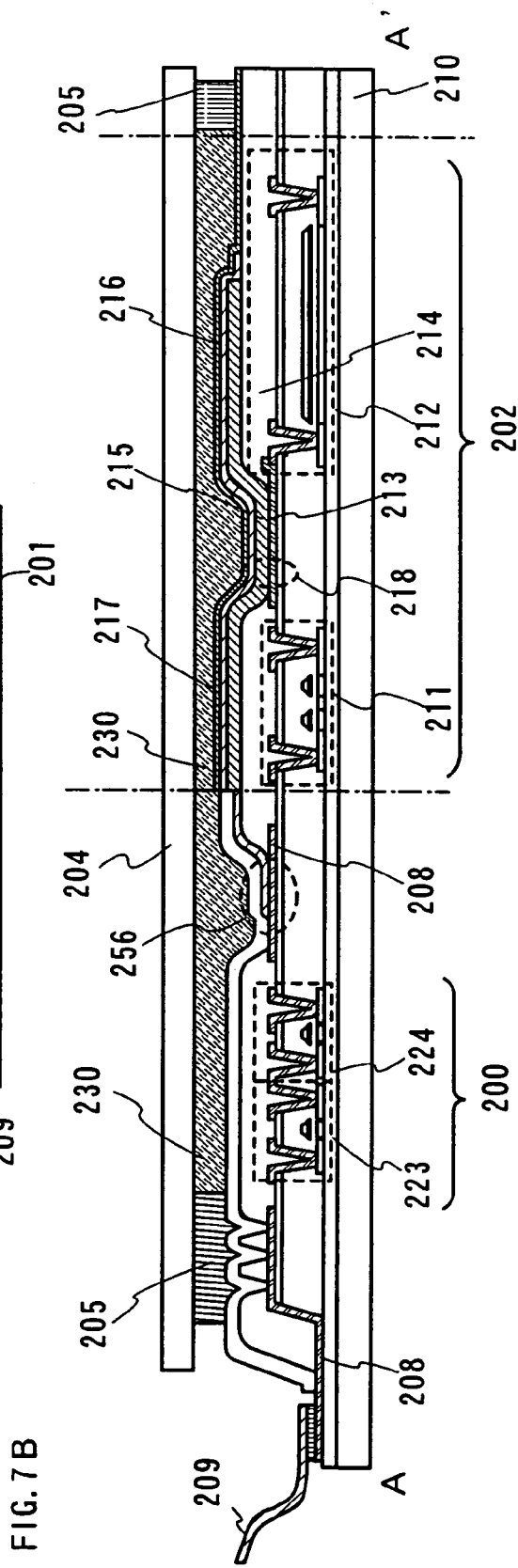
Figures 9A, 9B:
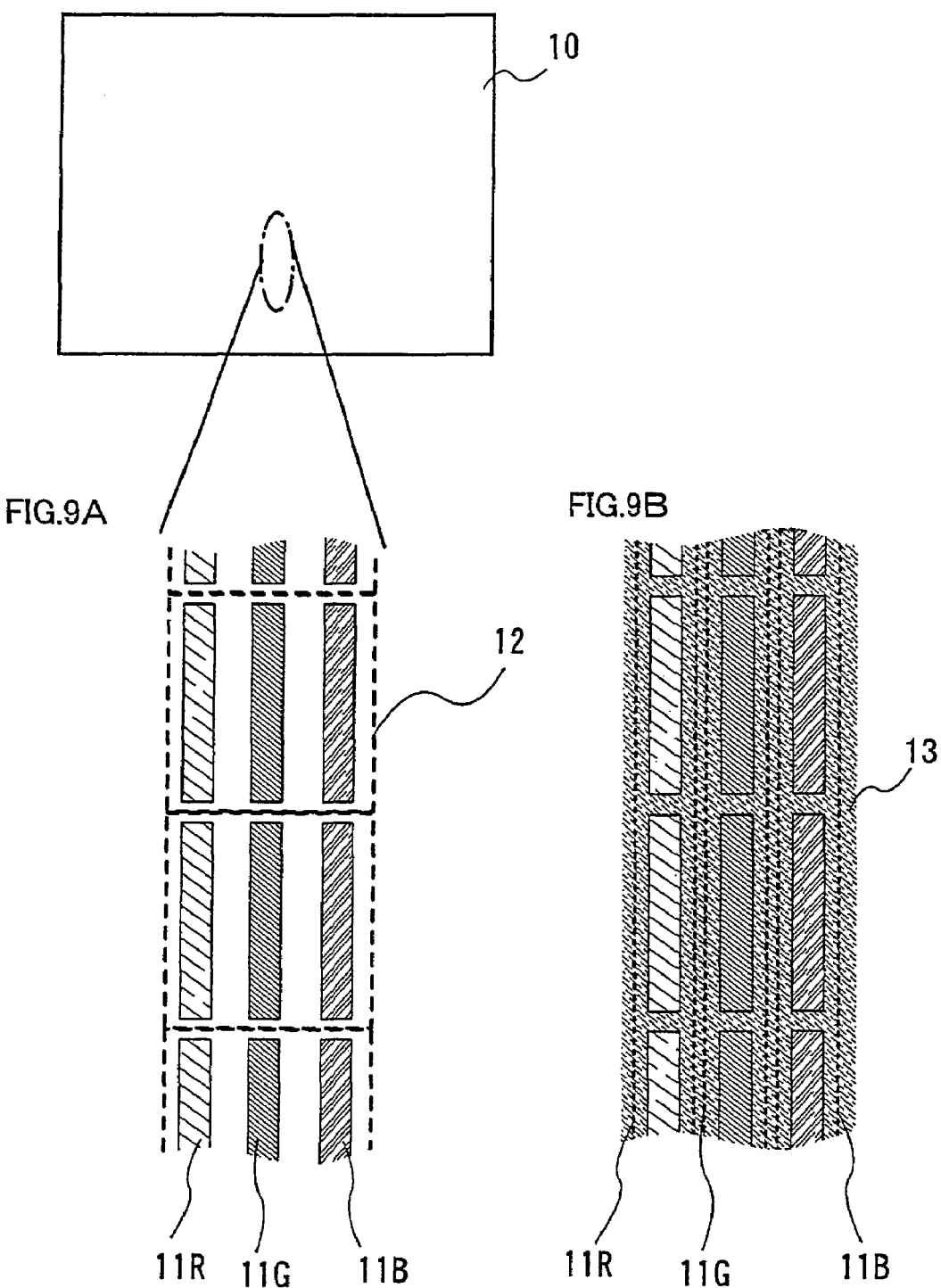
FIGS. 9A and 9B are diagrams each showing a layout of a conventional pixel.

FIG. 7B is a sectional diagram of the light emitting device of FIG. 7A along A-A'. A signal driver circuit 200 provided with a CMOS circuit having an N-channel type TFT 223 and a P-channel type TFT 224 is provided on the first substrate 210. The N-channel type TFT 223 and the P-channel type TFT 224 can be formed of polycrystalline semiconductor films formed by a laser crystallization method or a thermal method using a metal catalyst. The TFTs in the signal driver circuit 200 and the scan driver circuit 201 can be formed of a CMOS circuit, a PMOS circuit, or an NMOS circuit.

In the case of using an amorphous semiconductor film, a driver circuit such as a signal driver circuit or a scan driver circuit can be mounted as an IC chip. Such driver circuits are mounted by a TAB method or by a COG method in the periphery of the pixel portion. In the case of mounting by the TAB method, in particular, the pixel portion can be provided larger with respect to the substrate, thus a narrower frame can be obtained. In the case of using an SAS, the scan driver circuit only can be integrally formed on the substrate and the signal driver circuit can be mounted separately as a driver.

An IC chip is formed by using a silicon wafer, however, an IC formed on a glass substrate (hereinafter referred to as a driver IC) may be provided instead of an IC chip. The IC chip is taken out of a circular silicon wafer, therefore, a shape of a mother substrate is restricted. A driver IC, on the other hand, is advantageous in improving productivity since a mother substrate is glass of which shape is not restricted. Therefore, a shape and a size of a driver IC can be freely designed. In the case of forming a driver IC as its long side being 15 to 80 mm, a required number thereof can be reduced as compared to the case of mounting an IC chip. As a result, the number of connecting terminals can be reduced, which improves a production yield. fluorescence and phosphorescence may be combined. One of the fluorescence and the phosphorescence can be selected according to light emission characteristics (emission luminance, lifetime and the like) of each RGB.

An electroluminescent layer includes an HIL (hole injection layer), an HTL (hole transporting layer), an EML (light emitting layer), an ETL (electron transporting layer), and an EIL(electron injection layer) laminated in this order from the first electrode 213 side. Note that the electroluminescent layer can have a single layer structure or a combined stucture as well as a laminated structure.

Specifically, CuPu and PEDOT are used for the HIL a-NPD is used for the HTL, BCP and Alq$_3$ are used for the ETL, and BCP : Li and CaF$_2$ are used for EIL. For the EML, for example, Alq$_3$, doped with a dopant corresponding to each light emitting color of R, G, and B (DCM and the like for the color R, DMQD and the like for the color G) may be used.

Note that the elecmluminescent layer is not limited to the aforementioned material. For example, oxide such as molybdenum oxide (MoOx : x =2 to 3) and a-NPD and rubrene are co-deposited instead of CuPu and PEDOT, thereby a hole injection property can be improved. Also, benzaxazole derivative (described as BzOS) may be used for the electron injection layer.

In this embodiment mode, materials for light emission of red (R), green (G), and blue (B) can be formed as the electroluminescent layer 215 according to the layout described in the aforementioned embodiment mode. Further, materials for lighl emission of red (R), green (G), and blue (B) may be formed by the liquid droplet ejection method according to the layout described in the afomentioned embodiment mode.

Moreover, in the case of forming an electrolurminescent layer of each RGB, a high definition display can be performed by using a color filter. With a color filter, a broad peak of a light emission spectra from elements of each color can be corrected to be sharp. An arrangement of color filters of each RGB can be formed similarly to the layout described in the aforementioned embodiment mode. Furthermore, color filters of each RGB can be formed by the liquid droplet ejection method.

An insulator 214 can be formed of an inorganic material (silicon oxide, silicon nitride, silicon oxynitride and the like), a photosensitive or non-photosensitive organic material (polyimide, acryl, polyimide, polyimide amide, resist, or benzocychrobtensn), siloxane, A driver IC can be formed by using a crystalline semiconductor formed on a substrate, which can be formed by irradiating continuous oscillation laser light. A semiconductor film obtained by irradiating the continuous oscillation laser light has less crystal defects and crystal grains of large diameter. As a result, a transistor having such a semiconductor film has good mobility and response which enables a high speed drive and is preferable for a driver IC.

The pixel portion 202 includes a switching TFT 221 and a driving TFT 212. The switching TFT 221 and the driving TFT 212 can be formed of polycrystalline semiconductor films formed by a laser crystallization method or a thermal method using a metal catalyst. Also, an amorphous semiconductor film can be used. Note that a TFT in the pixel portion is not required to have a high crystallinity as compared to a TFT in a driver circuit, therefore, TFTs for the pixel portion and the driver portion may be formed differently.

The pixel portion includes a light emitting element 218 connected to one electrode of the driving TFT 212. The light emitting element 218 includes a first electrode of the light emitting element 218 (hereinafter referred to as a first electrode), an electroluminescent layer 215 which covers the switching TFT 221 and the driving TFT 212 and is divided by a bank 214 having an aperture at a position corresponding to the first electrode 213, and a second electrode 216 of the light emitting element provided on the electroluminescent layer.

An electroluminescent layer may be formed of an organic material (including a low molecular weight material and a high molecular weight material) or a composite material of an organic material and an inorganic material. The electroluminescent layer can be formed by vapor deposition or the liquid droplet ejection method. A high molecular weight material is preferably applied by an application method such as a liquid droplet ejection method while a low molecular weight material is preferably applied by vapor deposition, in particular vacuum vapor deposition. In this embodiment mode, a low molecular weight material is formed as an electroluminescent layer by vacuum vapor deposition using a metal mask as described above.

Note that an electroluminescent layer can generate a molecule exciton of a singlet exciton state or a triplet exciton state. A base state is normally a singlet exciton state and a light emission from the singlet exciton state is referred to as fluorescence. Light emission from the triplet exciton state is referred to as phosphorescence. Light emission from an electroluminescent layer includes the cases contributed by both exciton states. Moreover, polysilazane, and a laminated structure of these. A positive type photosensitive organic resin or a negative type photosensitive organic resin can be used as an organic material. Siloxane has a backbone structure of silicon (Si) and oxygen (O) and is formed of a polymer material as a starting material having at least hydrogen as a substituent or at least one of fluoride, alkyl group, or aromatic carbon hydride as a substituent. Polysilazane is formed of a polymer material of silicon (Si) and oxygen (O), namely a liquid material containing polysilazane as a starting material. In the case of using positive type photosensitive acryl as an organic material, for example, an aperture having a curvature at an upper portion can be formed by etching the photosensitive organic resin by exposure treatment. Therefore, a break of an electroluminescent layer and the like formed in a subsequent step can be prevented. Note that in the case of using an organic resin film and the like, an insulating film containing silicon nitride or silicon nitride oxide or a DLC (Diamond Like Carbon) film containing hydrogen is preferably formed in order to prevent moisture or oxygen from entering.

Any of the top emission type, the bottom emission type, and the dual emission type can be selected depending on a material for the first electrode 213 and the second electrode 216. For example, by using a light-transmitting conductive film for the first electrode and the second electrode, a dual emission type light emitting device can be formed. For an electrode of a light emitting element provided on a side to which light is not emitted, a highly reflective conductive film is preferably used to utilize light effectively.

Note that either of the first electrode 213 and the second electrode 216 can be an anode or a cathode depending on a pixel structure. A material for an electrode is specifically described in the case where the first electrode is an anode and the second electrode is a cathode.

As an anode material, a metal, an alloy, an electrically conductive compound each having a high work function (work function of 4.0 eV or more) and a compound of these materials and the like are preferably used. Specifically, ITO (indium tin oxide), IZO (Indium Zinc Oxide) obtained by mixing 2 to 20% or zinc oxide (ZnO) in indium oxide as well as gold (Au), platinum (Pt), nickel (Ni), tungsten (W), chromium (Cr), molybdenum (Mo), iron (Fe), cobalt (Co), copper (Cu), palladium (Pd), or a nitride of a metal material (TiN) and the like can be used.

On the other hand, as a cathode material, a metal, an alloy, an electrically conductive compound each having a low work function (work function of 3.8 eV or less) and the like are preferably used. Specifically, an element from group 1 or 2 of Periodic Table of the Elements, that is an alkali metal such as Li and Cs, an alkali earth metal such as Mg, Ca, and Sr, an alloy containing these (Mg:Ag, Al:Li) and a compound (LiF, CsF, and $CaF_2$) as well as a transition metal containing rare earth metal can be used. However, the cathode is required to transmit light, therefore, these metals or an alloy containing these metals are formed thin and laminated with a metal such as ITO (including an alloy thereof). The anode and cathode can be formed by vapor deposition, sputtering and the like.

Heretofore described is the case of forming an electroluminescent layer of each RGB, however, an electroluminescent layer which exhibits light emission of a single color may be formed as well. Even in the case of forming an electroluminescence which exhibits a single color, a full color display can be realized by combining a color filter and a color conversion layer. A layout of the color filter and the color conversion layer is arranged as described in the aforementioned embodiment mode. The color filter and the color conversion layer are formed on a second substrate, for example, and may be adhered to the first substrate. Also, the color filter may be formed on a first substrate, that is, so-called a COA structure may be employed. In the case of performing a dual emission display in which light is emitted from an electroluminescent layer to the first substrate 210 side and the second substrate 204 side, color filters may be provided on the both substrates.

Further, an electroluminescent layer which exhibits light emission of a single color may be formed to perform a monochrome display. For example, an area color type display can be performed by using a monochrome light emission. A passive matrix structure is suitable for the area color type which can mainly display text and signs.

In order to prevent a deterioration of a light emitting element due to moisture, oxygen and the like, a protective film 217 provided so as to cover a second electrode of a light emitting element is included. In this embodiment mode, an insulating film containing silicon nitride or silicon nitride oxide as a main component obtained by sputtering (DC method or RF method) or a DLC (Diamond Like Carbon) film containing hydrogen is used for the protective film 217.

As shown in FIG. 7, the second electrode 216 of the light emitting element is connected to a connecting wiring 208 through a lead wiring from an aperture provided in the bank 214 in the connecting region 256. The connecting wiring 208 is connected to the FPC 209 by an anisotropic conductive resin (ACF). Then, the connecting wiring 208 receives a video signal and a clock signal as an external input signal through the FPC 209. Here, only an FPC is shown, however, a printed wiring board (PWB) may be attached to the FPC.

The sealing material 205 is provided in the periphery of the first substrate 210, thereby the first substrate 210 and the second substrate 204 are attached and sealed. The sealing material 205 is preferably an epoxy resin. The sealing material 205 includes a spacer by which a space, that is a gap between the first substrate 210 and the second substrate (also referred to as a counter substrate and a sealing substrate) 204 is held. A spacer having a spherical or columnar shape is used and a cylindrical spacer of which diameter corresponds to a gap is used in this embodiment. The second substrate may be provided with a drying agent, by which can prevent moisture and oxygen from entering.

By sealing with the second substrate 204, a space is formed between the second substrate 204 and the protective film 217. The space is filled with an inert gas such as nitrogen gas or a material with high moisture absorption so that moisture and oxygen do not entered. In this embodiment mode, a resin 230 which transmits light and has high moisture absorption is formed. The resin 230 transmits light, therefore, even in the case where the light from an electroluminescent layer is emitted to the second substrate side, a transmissivity is not decreased.

In order to enhance contrast, at least a polarizer or a circular polarizer is preferably provided in a pixel portion. In the case where a display is seen from the second substrate side, a plate, a ¼λ plate, ½λ plate, and a polarizer may be provided in this order from the second substrate 204 side. Moreover, an anti-reflection film may be provided on the polarizer.

Such a light emitting device is provided in a housing of an electronic device, thereby a product is completed. A head sink and the like are preferably provided in the housing for transferring away the heat generated by the light emitting device.

Embodiment Mode 6

In this embodiment mode, a structure of a liquid crystal display device having a color filter and the layout of the invention are described.

FIG. 8A is a top plan view of a liquid crystal display device including the signal driver circuit 200, the scan driver circuit 201, and the pixel portion 202 provided on the first substrate 210 which is adhered to a second substrate 204 with the sealing material 205. A signal from an external circuit is inputted to the signal driver circuit and the scan driver circuit through the FPC 209.

FIG. 8B is a sectional view of the display device of FIG. 5A along A-A' including the signal driver circuit 200 provided with a CMOS circuit having the N-channel type TFT 223 and the P-channel type TFT 224. Each TFT can be formed by using a polycrystalline semiconductor film formed by a laser crystallization method or a thermal method using a metal catalyst.

In the case of using an amorphous semiconductor film similarly to the light emitting device, a driver circuit such as a signal driver circuit or a scan driver circuit can be mounted as an IC chip or a driver IC.

The pixel portion 202 includes a switching TFT 221 and a capacitor 245. The switching TFT 221 can be formed of a polycrystalline semiconductor formed by a laser crystallization method or a thermal method using a metal catalyst, an SAS, or an amorphous semiconductor. The capacitor 245 can be formed of a gate insulating film sandwiched by a semiconductor film added impurities and a gate electrode. A pixel electrode 250 is provided so as to connect to one electrode of the switching TFT 211. The signal driver circuit 200 includes the N-channel type TFT 223 and the P-channel type TFT 224. An insulator 214 is provided so as to cover the signal driver circuit 200, the pixel electrode 250, and the switching TFT 211 as required, which can enhance the planarity.

The second substrate 204 is provided with a black matrix 253 at a position corresponding to the signal driver circuit 200 and a color filter 252 is provided at least at a position corresponding to the pixel portion. The color filter 252 can be formed by using a layout of the aforementioned embodiment mode. At this time, a black matrix is formed instead of a bank. Then, the second substrate 204 on which a counter electrode is formed is applied rubbing treatment, then attached with the first substrate 210 sandwiching a spacer 255.

A liquid crystal layer is injected between the first substrate 210 and the second substrate 204. The liquid crystal layer is preferably injected in a vacuum atmosphere. Alternatively, the liquid crystal layer may be discharged on the first substrate 210 and the second substrate 204 may be attached thereon. The liquid droplet ejection method can be used for discharging liquid crystal. It is preferable to discharge than inject the liquid crystal layer on a large substrate in particular.

By using the liquid droplet ejection method, a chamber becomes large as a larger substrate is used, thus the weight of the substrate becomes heavy, which leads to a difficulty in the process.

In the case of discharging liquid crystals, a sealing material is formed in the periphery of one of the substrates. The sealing material may be formed in either of the first substrate 210 and the second substrate 204. At this time, the sealing material is formed so that a starting point and an ending point of the sealing member meets and closes up. After that, one or a plurality of drops of liquid crystals are discharged. In the case of a large substrate, a plurality of drops of liquid crystals are discharged on a plurality of positions. Then, the substrate is attached with the other substrate under vacuum. By attaching under vacuum, unnecessary air can be removed and a break and distension of the sealing material caused by air can be prevented.

Next, two or more points of a region in which the sealing material is formed is solidified and adhered for temporary attachment. In the case of using an ultraviolet curing resin for the sealing material, two or more points of the region in which the sealing material is formed are irradiated with ultraviolet ray. After that, the substrate is taken out the chamber and the sealing material is entirely solidified and adhered as an actual attachment. At this time, a light shield is preferably provided so that the ultraviolet ray is not irradiated on a thin film transistor and a liquid crystal.

Further, in order to hold a gap between the substrates, a columnar or spherical spacer is preferably used besides the sealing member.

After that, a polarizer or a circular polarizer is provided to the first substrate 210 and the second substrate 204 to enhance contrast. Moreover, an antireflective film may be provided as well.

After that, the FPC 209 is adhered by using an anisotropic conductive film to connect an external circuit and a signal driver circuit or a scan driver circuit.

EMBODIMENT

Embodiment 1

In this embodiment, a result of a display simulation by using the layout of a pixel described in Embodiment Mode 1 is described.

Figure 10:
FIG. 10 shows an image displayed by a light emitting device of the invention.
Figure 11:
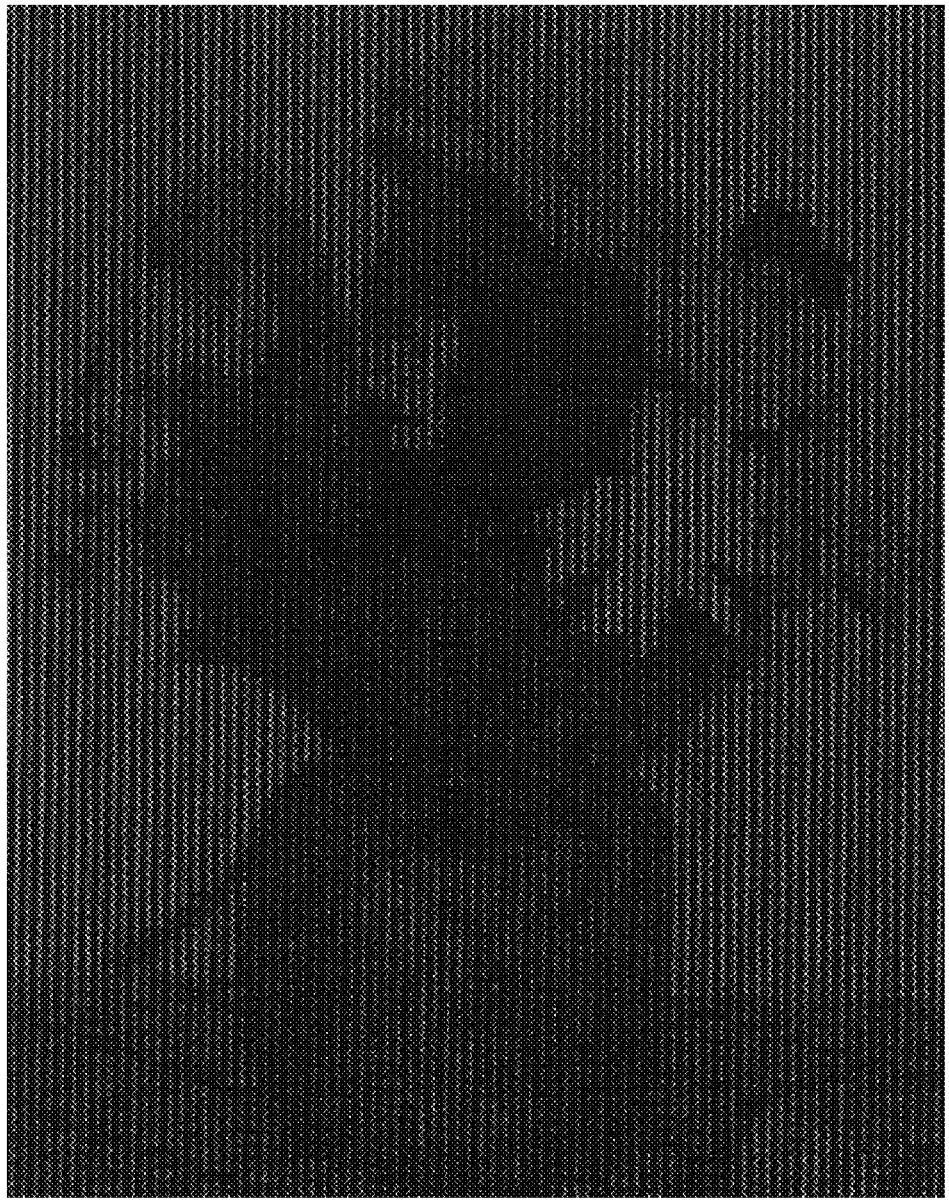
FIG. 11 shows an image displayed by a conventional light emitting device.

FIG. 10 shows an image in the case of using the layout of a pixel described in Embodiment Mode 1 and FIG. 11 shows an image in the case of using a conventional layout of a pixel arranged in a stripe shape. In FIGS. 10 and 11, an element pitch, that is an interval between banks is the same. It can be seen that the image is finer in FIG. 10 which has the layout of the pixel of the invention than FIG. 11.

Figure 12:
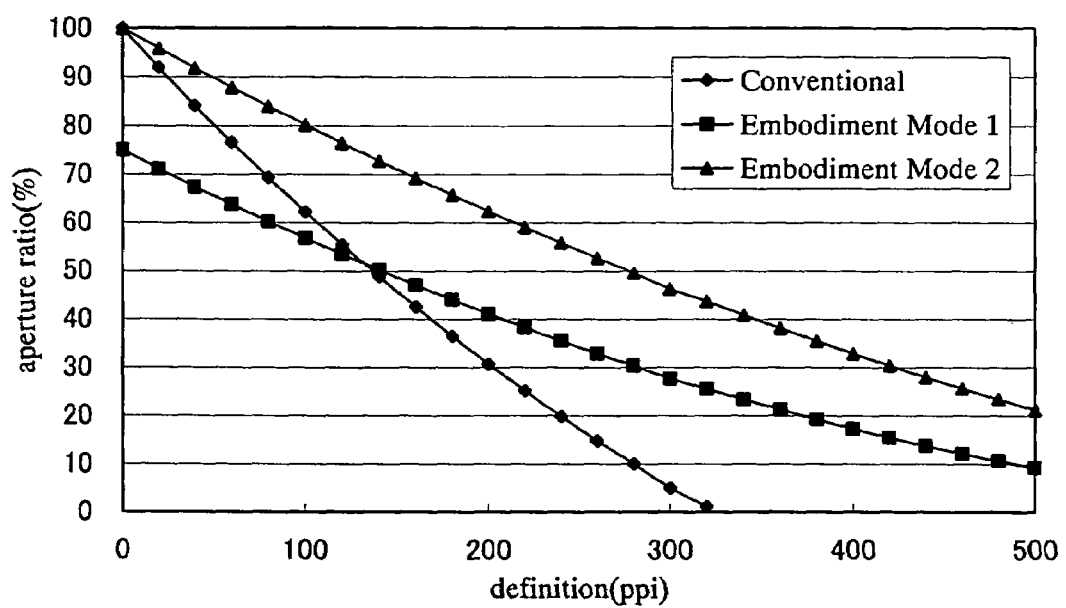
FIG. 12 is a graph showing a relationship between definition and an aperture ratio according to a layout of a pixel of the invention.

FIG. 12 shows a relationship between a definition and an aperture ratio of the layout of the pixel described in Embodiment Modes 1 and 2 and a conventional layout of the pixel. In the case where definition is 302 ppi (one side of a pixel is 84 µm), an aperture ratio is 4.9% in the conventional layout of the pixel arranged in a stripe shape while an aperture ratio is 27.6% in the layout of the pixel described in Embodiment Mode 1 and an aperture ratio is 46.3% in the layout of the pixel described in Embodiment Mode 2.

In this manner, high definition of a display can be achieved according to the layout of the pixel of the invention even with a similar element pitch to a conventional one.

This application is based on Japanese Patent Application serial no. 2003-420204 filed in Japan Patent Office on Dec. 17, 2003, the contents of which are hereby incorporated by reference.

What is claimed is:

1. A display device comprising:
at least first two regions, each having at least three elements for emitting a first color, one of the first two regions being in a first column and the other one being in a second column neighboring the first column;
at least second two regions, provided adjacent to the first two regions, each having at least three elements for emitting a second color, one of the second two regions being in the first column and the other one being in the second column;
at least third two regions, provided adjacent to the first two regions and the second two regions, each having at least three elements for emitting a third color, one of the third two regions being in the first column and the other one being in the second column; and
a pixel comprising one of the three elements in the first region in the first column, one of the three elements in the second region in the first column, and one of the three elements in the third region in the second column,
wherein one of the first two regions is disposed in an oblique direction of the other first two regions, one of the second two regions is disposed in an oblique direction of the other second two regions, and one of the third two regions is disposed in an oblique direction of the other third two regions,
wherein the first two regions, the second two regions, and the third two regions are arranged with regularity in the first and the second column direction,
wherein each of the first two regions, the second two regions, and the third two regions in the first column has an offset alone the first and the second column direction to each of the first two regions, the second two regions, and the third two regions respectively in the second column, and
wherein a width of the offset is 1.5 times as long as a total length of a distance between the first region and the second region, and a width of the first region.

2. The display device according to claim 1, wherein an electroluminescent display is used for the display device.

3. The display device according to claim 1, wherein the first two regions, the second two regions, and the third two regions are disposed in a matrix state.

4. The display device according to claim 1, wherein the elements which are comprised in the pixel are arranged in a I-shape.

5. The display device according to claim 1, wherein the pixel comprises a first element in the first two regions, a second element in the second two regions, and a third element in the third two regions, and
wherein the second element and the third element are disposed in a column of the adjacent column in which the first element, and the second element and the third element have an offset against the first element in a column direction, and the width of the offset is a half of the width of the first element or the second element or the third element.

6. A display device comprising:
a first region including first two light emitting elements and second two light emitting elements, each for emitting a first color, wherein the first two light emitting elements are operationally connected to a first scanning line and the second two light emitting elements are operationally connected to a second scanning line;

a second region including third two light emitting elements and fourth two light emitting elements, each for emitting a second color, wherein the third two light emitting elements are operationally connected to the first scanning line and the fourth two light emitting elements are operationally connected to the second scanning line;

a third region including fifth two light emitting elements and sixth two light emitting elements, each for emitting a third color, wherein the fifth two light emitting elements are operationally connected to a third scanning line and the sixth two light emitting elements are operationally connected to a fourth scanning line;

a pixel comprising one of the second two light emitting elements of the first region, one of the fourth two light emitting elements of the second region and one of the fifth two light emitting elements of the third region.

7. The display device according to claim 6, wherein each of the first region, the second region and the third region has four light emitting elements.

8. The display device according to claim 6, wherein each of the first region, the second region and the third region has six light emitting elements.

* * * * *